United States Patent [19]

Kultgen

[11] Patent Number: 5,541,531
[45] Date of Patent: Jul. 30, 1996

[54] SWITCH CAPACITOR INTERFACE CIRCUIT

[75] Inventor: Michael A. Kultgen, Colorado Springs, Colo.

[73] Assignee: Ford Motor Company, Dearborn, Mich.

[21] Appl. No.: 432,378

[22] Filed: May 1, 1995

[51] Int. Cl.[6] .............................................. H03K 19/0185
[52] U.S. Cl. .............................. 326/62; 326/68; 327/534
[58] Field of Search .............................. 326/21, 62, 63, 326/68, 113; 323/316, 352, 253, 209, 210, 211; 327/534, 536

[56] References Cited

U.S. PATENT DOCUMENTS

| | | | |
|---|---|---|---|
| 4,405,964 | 9/1983 | Woods et al. | 361/18 |
| 4,438,473 | 3/1984 | Cawley et al. | 361/18 |
| 4,493,092 | 1/1985 | Adams | 326/62 |
| 4,710,647 | 12/1987 | Young | 327/536 |
| 4,716,319 | 12/1987 | Rebeschini | 327/554 |
| 4,752,699 | 6/1988 | Cranford, Jr. et al. | 327/100 |
| 4,868,419 | 9/1989 | Austin | 326/113 |
| 4,937,700 | 6/1990 | Iwahashi | 361/91 |
| 5,003,197 | 3/1991 | Nojima et al. | 327/536 |
| 5,057,707 | 10/1991 | Pigott | 327/536 |
| 5,140,196 | 8/1992 | Shepherd | 326/63 |
| 5,281,860 | 12/1994 | Krenik et al. | 327/407 |

OTHER PUBLICATIONS

Ping Wai Li, Michael J. Chin, Paul R. Gray, and Rinaldo Castello, "A Ratio–Independent Algorithmic Analog–to–Digital Conversion Technique", Dec. 1984.

Primary Examiner—Edward P. Westin
Assistant Examiner—Benjamin D. Driscoll
Attorney, Agent, or Firm—Kevin G. Mierzwa

[57] ABSTRACT

A switched capacitor interface circuit translates a voltage output of a sensor which is outside the range of the power supply voltage for a signal processing circuit to a voltage within that range. The circuit uses MOSFETs to control the switching. To prevent the MOSFETs from dielectrically breaking down, the voltages across the gate oxides are continuously and precisely controlled in relation to the output of the sensor.

20 Claims, 6 Drawing Sheets

SWITCH CAPACITOR INTERFACE CIRCUIT

BACKGROUND OF THE INVENTION

The present invention relates generally to an interface circuit connected between a processing component and a sensor. More specifically, the invention relates to an interface circuit that translates sensor voltages outside the voltage range of the power supply voltage of the processing component into voltages within range of the power supply voltage of the processing component.

Sensors, particularly in automotive applications, produce varying output voltages corresponding to particular sensed characteristics. The output of a sensor usually requires signal processing such as noise filtering and analog-to-digital conversion, for example. Signal processing circuits commonly use CMOS components having a zero to five volt power supply. It is common for sensors to produce an output voltage exceeding the range of the power supply of the CMOS circuitry. Voltages exceeding the power supply voltage result in an inaccurate measurement. Consequently, some interface circuit is required to translate the sensor voltage within the range of the power supply.

Previous voltage translation circuits use a MOS type transistor to perform switching of the sensor output voltages across a pair of capacitors according to a clock signal. This type of circuit is known as a switched capacitor circuit. However, this voltage translation circuitry does not take into account high voltages which may be developed at the switch. MOS type transistors have a gate terminal which is isolated from a drain terminal, a source terminal and bulk terminal by a gate oxide layer. The gate oxide layer must be thick enough to withstand excessive voltage potentials generated during the switching of the transistor. Sudden failure of the transistor due to extremely excessive voltages is an eventuality that must be taken into account by the design. Time dependent dielectric breakdown (TDDB) is another type of failure that occurs when the MOS type transistor breaks down over time due to the stress of excessive voltages across the gate oxide layer. The gate oxide layer of prior designs is formed thick enough (e.g., at least 250 angstroms thick) to withstand the relatively high voltage potentials developed during switching.

CMOS processes have been developed using thinner gate oxide thickness (e.g., 150 angstroms or less). Components using reduced oxide gate thickness are cheaper to manufacture, have faster switching times and have a smaller package size, all of which are desirable in integrated circuit designs. Previous voltage translation circuits generate high gate oxide voltages which would cause TDDB if thinner CMOS gate oxides were used.

It would therefore be desirable to incorporate thinner oxide layer MOSFETs into voltage translation circuitry without compromising the reliability of the circuitry.

SUMMARY OF THE INVENTION

One advantage of the circuit is that accurate voltage translation has been accomplished while controlling the operating voltages of the MOS transistors used within the circuit.

The present invention is an interface circuit connecting a sensor to a switched capacitor circuit. The switched capacitor circuit is connected to a processing component having a power supply voltage range. The sensor has an output voltage range outside the voltage range of the power supply.

The interface circuit includes a MOSFET switch connected between the sensor and the switched capacitor circuit for connecting the output voltage to the switched capacitor circuit. The MOSFET switch has a gate oxide layer, a switch conducting state resistance, a gate voltage and bulk voltage. A control circuit is connected to the output of the sensor and to the MOSFET switch and continually adjusts the gate voltage and the bulk voltage in relation to the output voltage to prevent a voltage across the gate oxide layer from exceeding a predetermined value corresponding to time dependent dielectric breakdown.

BRIEF DESCRIPTION OF THE DRAWINGS

FIG. 8 is a schematic of charge pump X10 of FIG. 6.

DETAILED DESCRIPTION OF PREFERRED EMBODIMENTS

Figure 1:
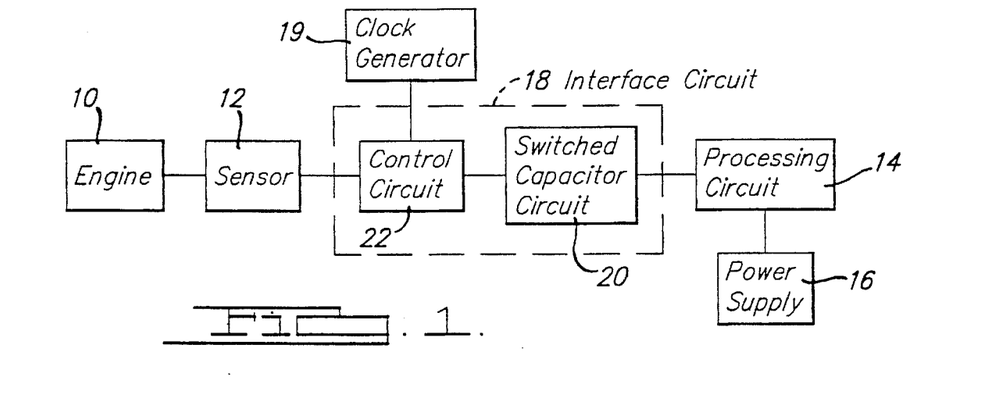
FIG. 1 is a block diagram of the present invention as used in an automotive system.

Referring to FIG. 1, automobiles have components such as an engine 10 requiring sensed operating parameters to be input to a processing circuit 14 such as an engine control module. Processing circuit 14 adjusts the operating parameters of engine 10 accordingly. A sensor 12 connected to some portion of engine 10 converts a monitored operating condition such as mass air flow into a corresponding electrical signal. Processing circuit 14 typically operates from a power supply 16 having a voltage supply range between zero and five volts.

For proper processing of the output signals of sensor 12, the input to processing circuit 14 must be within the voltage range of power supply 16. Many sensors, however, have output voltage ranges below zero volts and above five volts. An interface circuit 18 converts the output of sensor 12 into a signal processable by processing circuit 14.

Interface circuit 18 is preferably formed on a single integrated circuit chip. Interface circuit 18 comprises a switched capacitor circuit 20 and a control circuit 22 controlling the operation of switched capacitor circuit 20.

A clock generator 19 generates clock signals used for controlling circuit timing. The signals are shown below in reference to FIG. 9.

Figure 2:
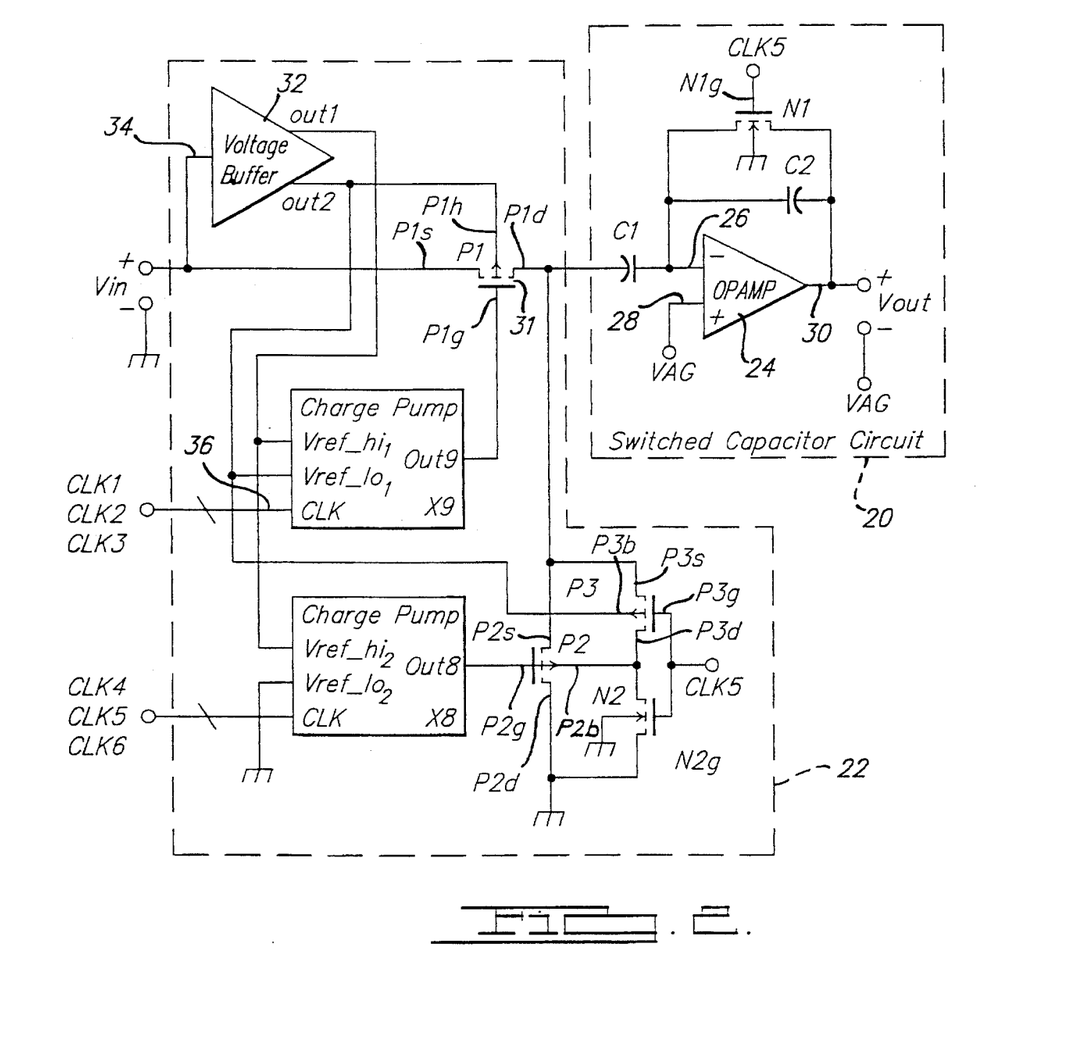
FIG. 2 is a schematic of an interface circuit according to the present invention.

Referring now to FIG. 2, a more detailed interface circuit 18 is shown. For illustrative purposes, an N-well CMOS integrated circuit is described, however, the principles described are equally applicable to other CMOS and other MOSFET technologies. The interface circuit of FIG. 2 has an input voltage Vin from the output of sensor 12 of between −1.5 volts and 5.0 volts. Interface circuit 18 operates between VDD which is five volts and VSS which is zero volts, i.e., ground potential.

Interface circuit 18 preferably uses an operational amplifier switched capacitor circuit, however, other circuits such as a comparator circuit may be employed. Operational amplifier 24 has an inverting terminal 26, a non-inverting terminal 28 and an output terminal 30. A feedback capacitor C2 is connected between inverting terminal 26 and output terminal 30. An NMOS switch N1 is also connected between inverting terminal 26 and output terminal 30. NMOS switch N1 has a gate N1g connected to a clock signal clk5 further described below. Inverting terminal 26 is connected to control circuit 22 through a capacitor C1. A reference voltage vag is connected to noninverting terminal 28. Reference voltage vag is defined as VDD/2 which in this case is 2.5 volts. Vag is preferably set half way between VDD and VSS to maximize the dynamic range of the processing circuit 14. The output voltage of operational amplifier 24 is Vout which is referenced to vag. The gain ratio of the operational amplifier circuit is –C1/C2. The accuracy of the circuit is primarily controlled by the gain ratio which is easily controlled if sufficiently large capacitors such as 1 picofarad for C1 and 2 picofarad for C2 are used.

Input voltage Vin is connected to capacitor C1 through PMOS switch P1. PMOS switch P1 has a bulk terminal P1b, a drain terminal P1d, a gate terminal P1g and a source terminal P1s. Switch P1 has a gate oxide layer 31 represented by the space between bulk terminal P1b, source terminal P1s and drain terminal P1d and gate terminal P1g. Drain terminal P1d is directly electrically connected to capacitor C1. Source terminal P1s is connected to the input voltage Vin. Gate terminal P1g is connected to a charge pump X9.

A voltage buffer 32 has an output out2 connected to bulk terminal P1b. Voltage buffer 32 has an additional output out1 and an input 34. Input 34 is connected to input voltage Vin. A preferred implementation of voltage buffer 32 is described below in FIG. 5.

Charge pump X9 has two inputs Vref_hi1 and Vref_lo1. Vref_hi1 is connected to output out1 of voltage buffer 32. Vref_lo1 is connected to output out2 of voltage buffer 32.

Charge pump X9 also has a clock input 36 which is connected to clock signals clk1, clk2, and clk3. Output signal out9 is connected to gate terminal P1g. The operation of charge pump X9 will be further described with reference to FIG. 4.

Still referring to FIG. 2 capacitor C1 is connected to PMOS switches P2 and P3. PMOS switch P2 has a drain terminal P2d, a bulk terminal P2b, a gate terminal P2g and a source terminal P2s. Drain terminal P2d is connected to VSS. Source terminal P2s is connected to capacitor C1. Gate terminal P1g is connected to a charge pump X8.

PMOS switch P3 has a drain terminal P3d, a bulk terminal P3b, a gate terminal P3g and a source terminal P3s. Drain terminal P3d is connected to bulk terminal P2b of switch P2. Source terminal P3s is connected to capacitor C1. Bulk terminal P2b is connected to output out2 of voltage buffer 32. Gate terminal P1g is connected to a clock signal clk5.

An NMOS switch N2 connects drain terminal P3d and bulk terminal P2b with VSS. Switch N2 has a gate terminal N2g which is connected to a clock signal clk5. A bulk terminal N2b is connected to VSS.

Charge pump X8 has two inputs Vref_hi2 and Vref_lo2. Vref_hi2 is connected to output out1 of voltage buffer 32. Vref_lo2 is connected to VSS.

Charge pump X8 also has a clock input 38 which is connected to clock signals clk4, clk5 and clk6. Output signal out8 is connected to gate terminal P2g. Charge pump X8 operates similarly to charge pump X9 further described in FIG. 4.

Generally, the switched capacitor circuit 20 operates as follows. Initially, switch P2 and switch N1 are conducting, while switch P1 is non-conducting. Capacitor C2 is discharged and voltage vag is placed across capacitor C1. Next, switches P2 and N1 are non-conducting, while switch P1 is conducting. The voltage at drain terminal P1d which was at zero volts rises to input voltage Vin. Capacitive coupling via C1 causes inverting terminal 26 of operational amplifier 24 to obtain a voltage equal to Vag+Vin. Feedback capacitor C2 provides a path to drive inverting terminal 26 to voltage vag. For the inverting terminal 26 to change from vag+Vin to vag, the voltage of output terminal 30 must change from vag to vag–(C1/C2)*Vin. Since the output voltage Vout of operational amplifier 24 is defined relative to vag, the transfer function is written –C1/C2 which accomplishes the switched gain. So, for example, if C1/C2=0.5, then input voltage Vin of –1.5 volts<Vin<6.5 volts results in –1.75 volts<Vout<1.75 volts relative to vag or relative to power supply voltage 0.75 volts to 4.25 volts.

The general discussion of the switched capacitor circuit above treated P1 and P2 as ideal switches. Several physical properties of PMOS switches are considered in the operation of control circuit 22 to achieve the goal of accurate voltage translation without degrading reliability. More specifically, the gate voltage of a PMOS switch must be several volts below the source or drain potential to enter the "on" state. The larger the source-to-gate potential, the lower the "on" resistance of the switch. The "on" resistance must be low enough to allow capacitors C1 and C2 to fully charge and discharge. For PMOS switches to enter the "off" state, the gate voltage must be greater than or equal to both the source and drain voltages. The voltage across the gate oxide layers i.e., the gate-to-bulk, gate-to-source and gate-to-drain voltages, must be minimized to minimize TDDB. In the present example, a gate oxide thickness of 15 nanometers is used. The circuit may also be easily modified for further reductions in the oxide layer thickness by reducing the potentials across the gate oxide layer further by increasing the number of components. Operation of such a circuit would operate in the same general way as the circuit described below.

The operating voltages of the PMOS switches are best illustrated by comparing the range limits of input voltage Vin. When Vin is –1.5 volts, the gate voltage of P1 must be less than –3.5 volts to yield a sufficient "on" resistance. When input voltage Vin is five volts, the bulk voltage must be at least five volts to prevent the parasitic PNP within switch P1 from turning "on." A total voltage of 8.5 volts across gate oxide layer causes time dependent dielectric breakdown. To avoid the breakdown, the interface circuit 18 continually adjusts the gate voltage and the bulk voltage in relation to said output voltage of sensor 12 to prevent a voltage across the gate oxide layer from exceeding a predetermined value corresponding to time dependent dielectric breakdown. This is accomplished in the in circuit using charge pump X8 and X9 and output buffer 32.

Figure 5:
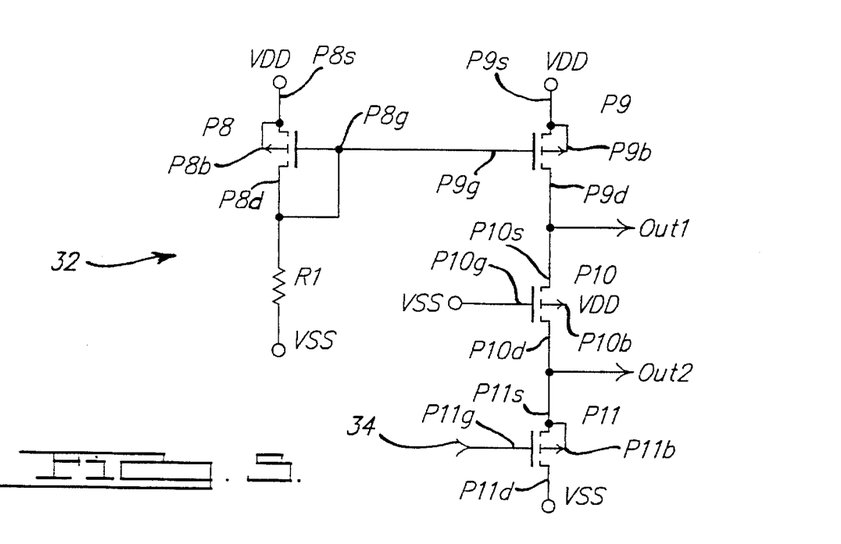
FIG. 5 is a schematic showing the input buffer of FIG. 2 in greater detail.

Referring now to FIG. 5, voltage buffer 32 supplies a bulk voltage to switch P1. Voltage buffer 32 is preferably configured as a source follower. Voltage buffer 32 is comprised of four PMOS transistors P8, P9, P10 and P11. PMOS transistor P8 has a drain terminal P8d, a bulk terminal P8b, a gate terminal P8g and a source terminal P8s. PMOS transistor P9 has a drain terminal P9d, a bulk terminal P9b, a gate terminal P9g and a source terminal P9s. PMOS transistor P10 has a drain terminal P10d3, a bulk terminal P10b, a gate terminal P10g and a source terminal P10s. PMOS transistor P11 has a drain terminal P11d, a bulk terminal P11b, a gate terminal P11g and a source terminal P11s.

Source terminal P8s is connected to bulk terminal P8b and both receive voltage VDD. Drain terminal P8d is connected to gate terminal P8g and both receive voltage VSS through a resistor R1 and gate terminal P9g.

Source terminal P9s is connected to bulk terminal P9b and both receive voltage VDD. Drain terminal P9d is connected to source terminal P10s the junction of which forms the output voltage out1 of input buffer 32.

Gate terminal P10g is connected to VSS. Bulk terminal P10b is connected to VDD. Drain terminal P10d is connected to source terminal P11s, the junction of which forms the output voltage out2 of input buffer 32. Bulk terminal P11b is directly connected to source terminal P11s. Drain terminal P10d is directly connected to VSS.

The voltages of the above circuit are dependent on the input 34 which is coupled to gate terminal P11g. By design, voltage out2 is always greater than input 34 to insure the bulk-drain and bulk source junctions of switch P1 do not forward bias. Also, voltage out2 never falls below ground to insure the P-substrate-Nwell junction of P1 does not forward bias.

Figure 4:
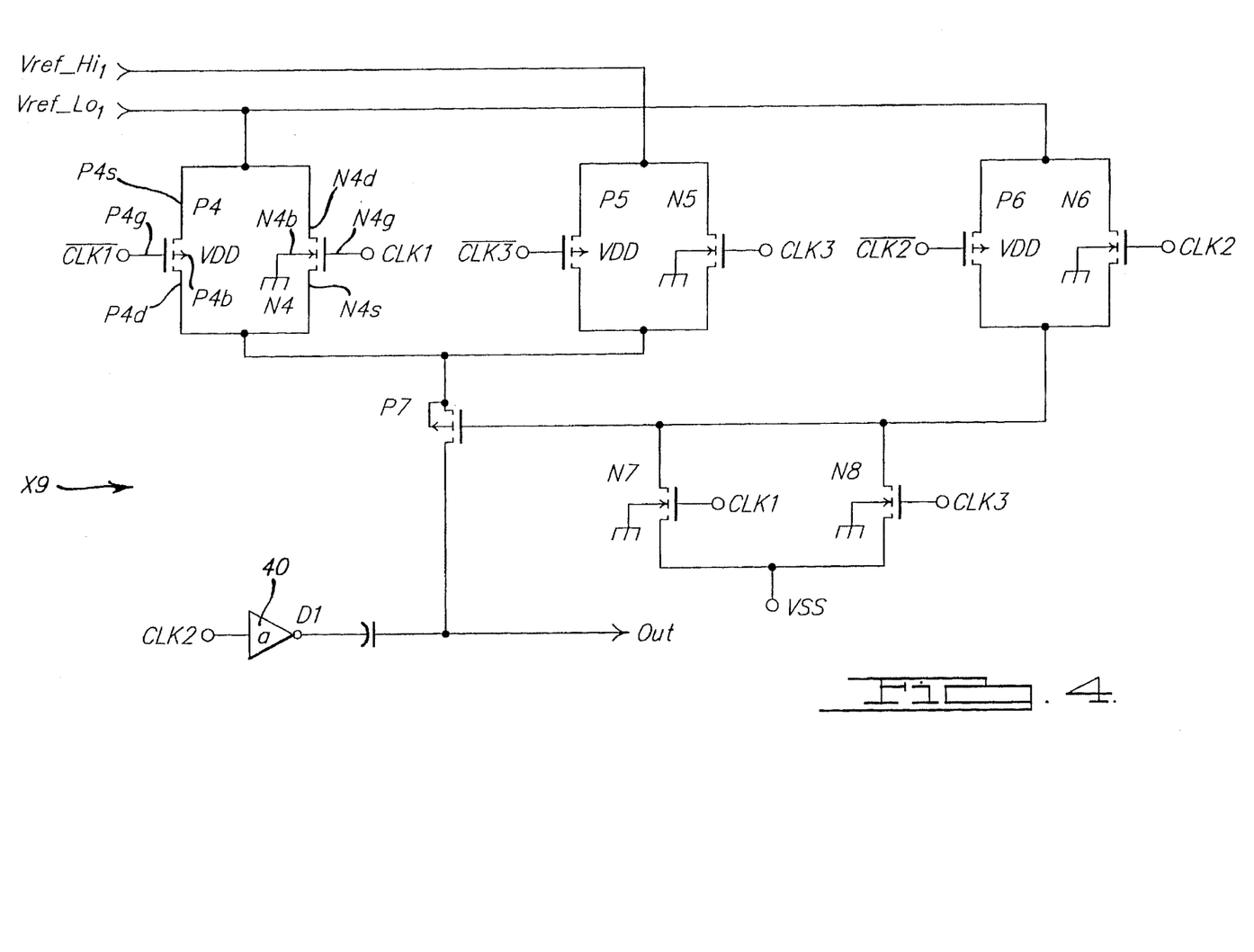
FIG. 4 is a schematic showing the charge pump of FIG. 2 in greater detail.

Referring now to FIG. 4, only charge pump X9 is shown in detail since charge pumps X9 and X8 use identical circuitry. Charge pump X9 has three parallel PMOS/NMOS combinations, each of which are identical with the exceptions noted below. Switches P4 and N4 have drain terminals P4d and N4d, bulk terminals P4b and N4b; gate terminals P4g and N4g and source terminals P4s and N4s, respectively. Drain terminal P4d is connected to source terminal N4s. Drain terminal N4d is connected to source terminal P4s. Gate terminal P4g is connected to inverted clock signal clk1. Bulk terminal P4b is connected to VDD. Gate terminal N4g is connected to clock signal clk 1. Bulk terminal N4b is connected to VSS.

The combination of switch P5 and switch N5 and the combination of switch P6 and switch N6 are connected the same except the following. Gate terminal P5g is connected to inverted clock signal clk3. Gate terminal N5g is connected to clock signal clk3. Gate terminal P6g is connected to inverted clock signal clk5. Gate terminal N6g is connected to clock signal clk5.

Source terminal P4s and drain terminal N4d are connected to vref_low1. Source terminal P5s and drain terminal N5d are connected to vref_ hi1. Source terminal P6s and drain terminal N6d are connected to vref_low1.

The three NMOS/PMOS combinations are connected to two NMOS switches N7 and N8 and to a PMOS switch P7. Switches P7, N7 and N8 each have drain terminal P7d, N7d and N8d, bulk terminal P7b, N7b and N8b, gate terminal P7g, N7g and N8g and source terminal P7s, N7s and N8s, respectively.

Source terminal N4s, drain terminal P4d, source terminal N5s and drain terminal P5d are connected to source terminal P7s and bulk terminal P7b. Source terminal N6s and drain terminal P6d are connected gate terminal P7g, drain terminal N7d and drain terminal N8d. Source terminal N7s and source terminal N8s are connected to VSS. Gate terminal N7g is connected to clock signal clk1. Gate terminal N8g is connected to clock signal clk3. Bulk terminals of N4 through N8 are connected to VSS.

Clock signal clk2 is inverted in an inverter 40 and is capacitively coupled though a capacitor 42 which is connected to drain terminal P7d and output signal OUT9. Output signal OUT9 for charge pump X9 is connected to gate terminal P1g. Output signal OUT8 for charge pump X8 is connected to gate terminal P2g.

Figure 3:
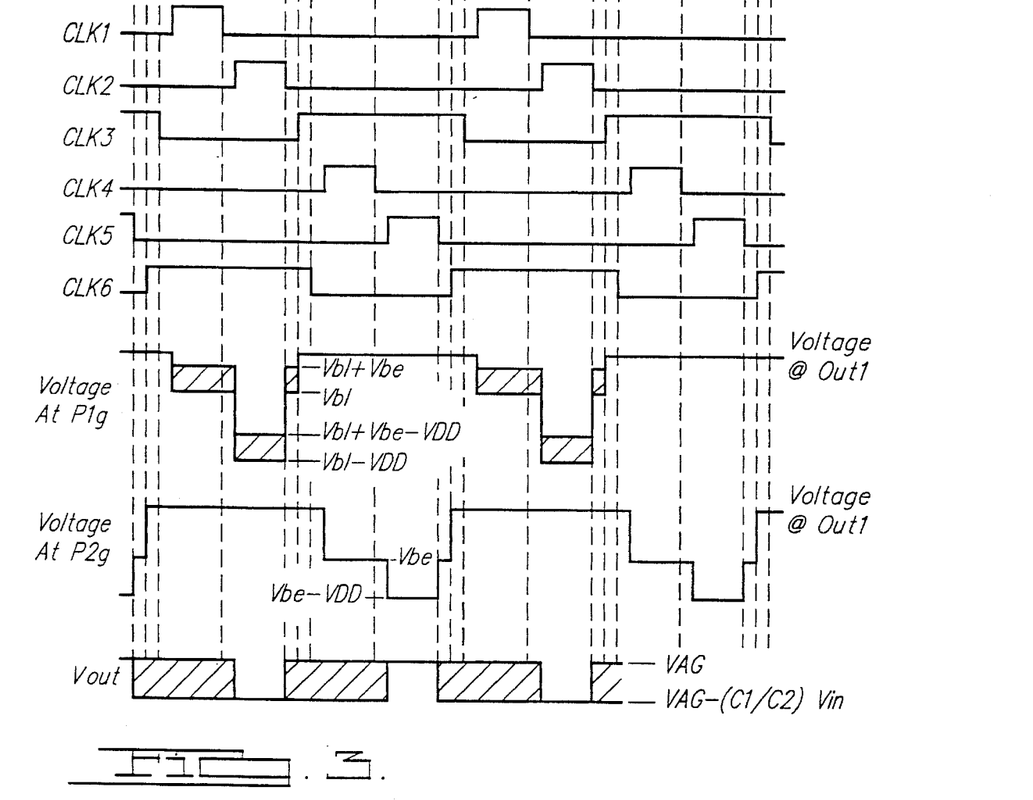
FIG. 3 is a signal timing chart of the interface circuit of FIG. 2.

The operation of charge pump is best described in reference to FIG. 2, FIG. 4 and the timing of signals as shown in FIG. 3. Clock signals clk1 to clk 5 are shown as generated by clock generator 19. The groups of clock signals are preferably non-overlapping waveforms (i.e., they are not high simultaneously). The non-overlapping clock waveforms result in non-overlapping waveforms at P2g so that switch P1 and switch P2 are not conducting simultaneously.

When clock signal clk1 goes high (i.e., a precharge phase), the output signal of charge pump X9 is driven to the voltage Vb1, but only if Vb1 is greater than the absolute value of threshold voltage of P7 (FIG. 4). Vb1 is defined as input voltage Vin plus the absolute value of threshold voltage of P11 (FIG. 5). If Vb1 is less than the absolute value of threshold of P7, output signal OUT9 will be less than Vb1+Vbe. Vbe is the base-emitter voltage of a parasitic PNP transistor formed by the source terminal P7s (i.e., the emitter of the PNP), bulk terminal P4b (i.e., the base of the PNP) and the underlying substrate (i.e.; the collector of the PNP).

When clock signal clk2 goes high (i.e., the "on"0 phase), switch P7 is turned off allowing output signal OUT9 to float. The output of inverter 40 changes from five volts to zero volts. During the "on" phase the output signal OUT9 is Vb1–VDD (or Vb1+Vbe–VDD if Vb1 is less than the absolute value of threshold voltage of P7). For input voltages Vin between the negative threshold voltage of P11 and VDD, the gate-source voltage of P1 is between Vin+(the absolute value of threshold of P11)–VDD and Vin+(threshold of P11)+Vbe–VDD. When Vin is below the absolute value of the threshold of P11, the on voltage does not follow Vin since the lower limit of Vb1 is VSS. The gate voltage of P1 thus has a lower limit of Vbe–Vdd. The gate-source voltage will eventually be too low to turn on switch P1. As an example, if the absolute value of the threshold voltage of P11 is one volt and Vbe is one volt the gate-source "on" voltage is always between –2.5 volts and four volts for values of Vin from –1.5 volts to 5 volts and the gate-bulk voltage is around –5 volts. Thus, TDDB is minimized.

Switch P1 turns off. During the high clock signal clk2, charge is transferred from capacitor C1 to capacitor C2. When clk2 goes low, a transition of zero to five volts is capacitively coupled to output signal OUT9.

When clock signal clk3 goes high (i.e., the off phase), switch P1 is held in the off state, switch P7 is on and OUT9 is driven to vref_hi9.

When clock signals clk4, clk5, and clk6 are high, capacitors C1 and C2 are discharged. Charge pump X8 operates in a similar manner to charge X9. The only difference is that the input Vref_lo2 is connected to VSS since the drain of P2 is always connected to VSS. The on gate voltage of P2 is Vbe–VDD.

When P2 is "off" (i.e., while clock signal clk6 is high), the bulk of P2 should not be allowed to forward bias since a current through the parasitic PNP transistor of P2 creates a voltage drop across switch P1. This voltage drop is a source of error since the input voltage Vin is required at drain terminal P1d for accuracy. When clk5 is high, bulk terminal P1b is shorted to VSS through N2. This causes the bulk-source junction of switch P2 to forward bias, intentionally turning on the parasitic PNP to discharge capacitor C1. Switch N2 is required to prevent a momentary large voltage across the gate oxide of P2, which would otherwise result fright after switching gate terminal P2g but before capacitor C1 discharges. Capacitor C2 is also discharged when clock signal clk5 is high.

Figure 6:
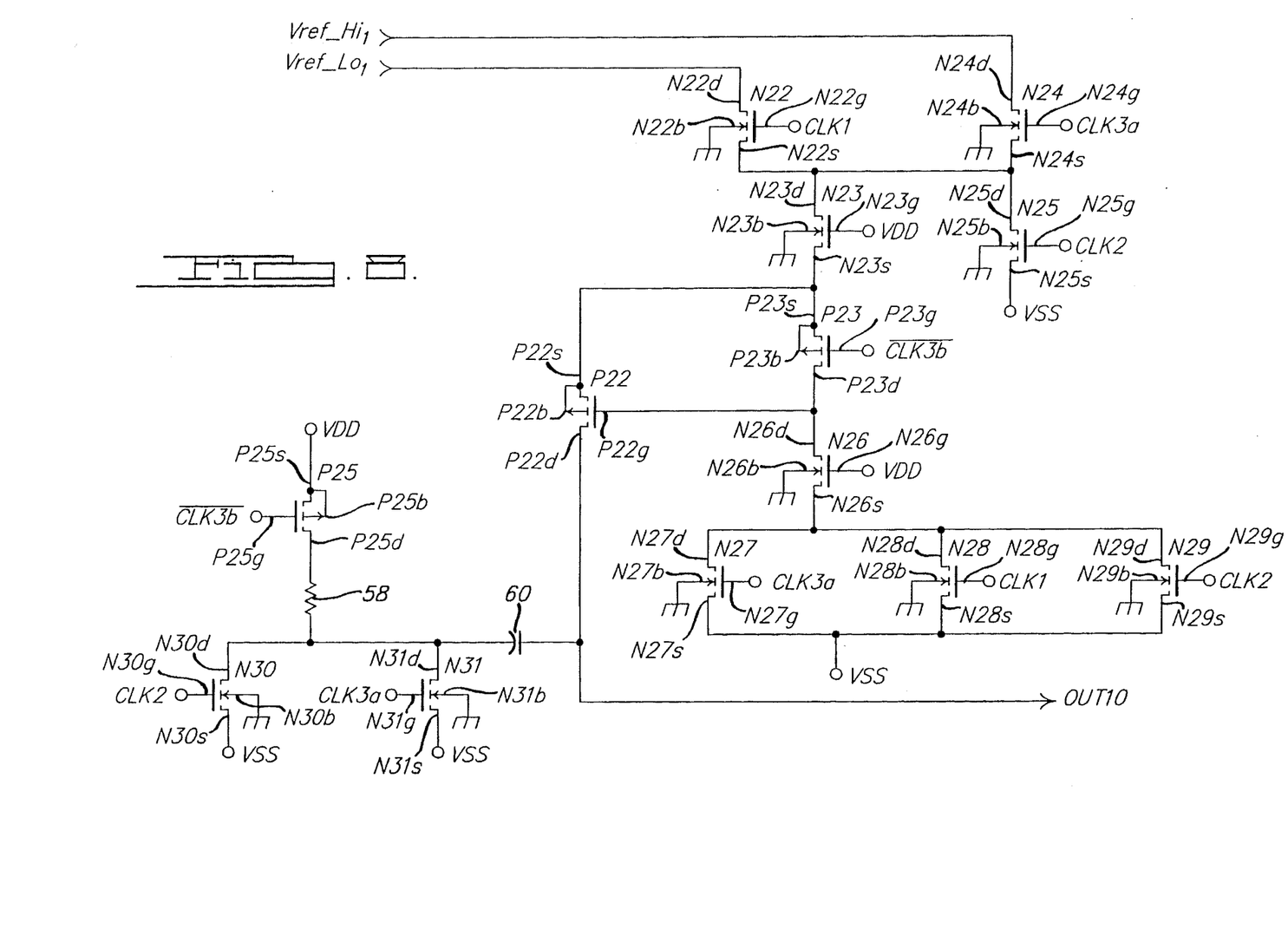
FIG. 6 is a schematic of an alternative embodiment of an interface circuit capable of processing a wider range of input voltages than the circuit of FIG. 2.
Figure 7:
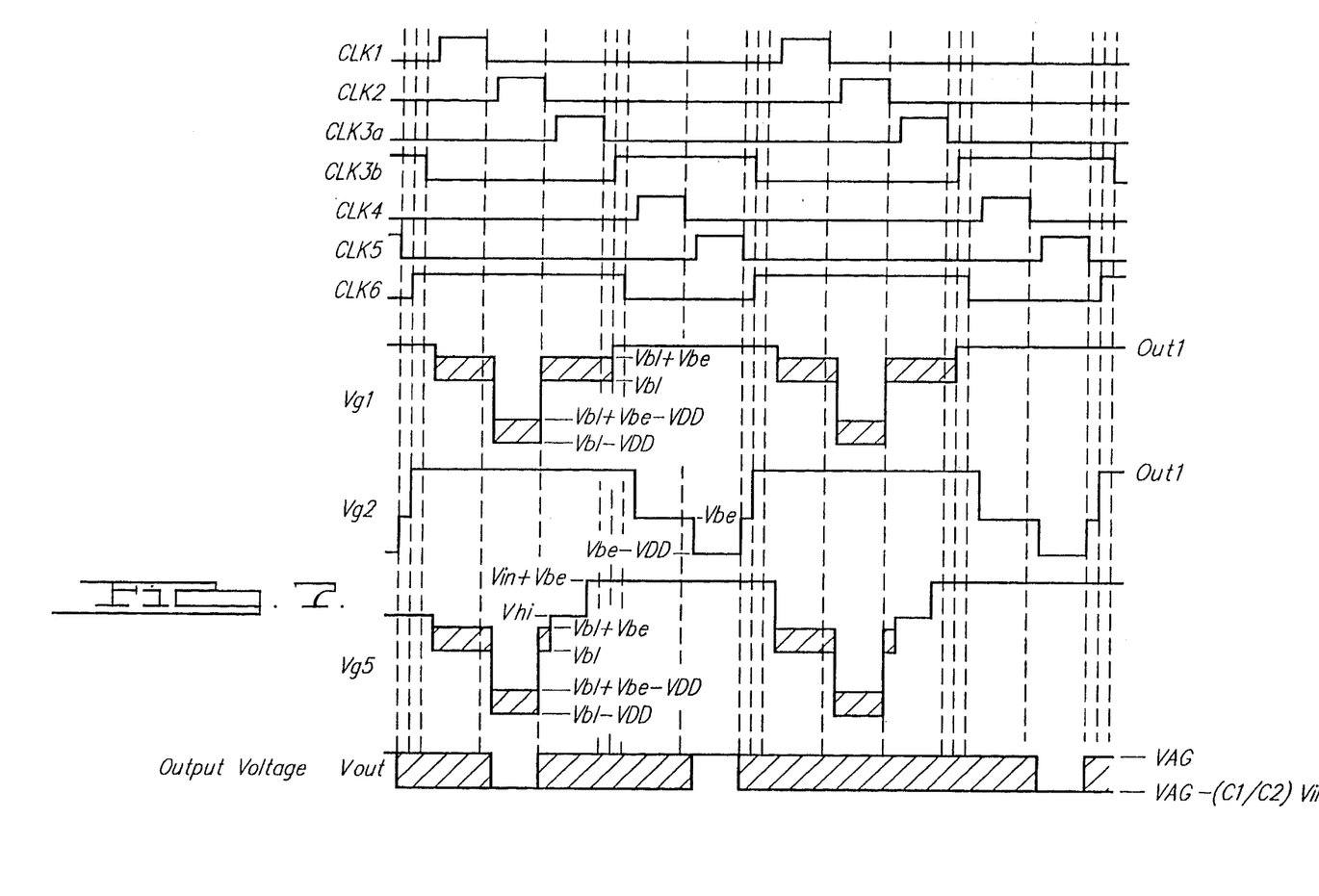
FIG. 7 is a signal timing chart of an interface circuit according to FIG. 6.

Referring now to FIGS. 6 through 8, the circuit of FIG. 1 has been modified for an embodiment where the maximum Vin exceeds five volts. (The previous example assumes a maximum Vin of five volts.) The following example presumes a maximum Vin of 6.5 volts. The reference numerals corresponding to components in FIG. 1 have been primed.

Switch N20 has been added to drain terminal P2d' to block current flowing through P2' when Vin is greater than five volts. The output signal OUT8 of charge pump X8' has a maximum value of five volts. When the drain terminal P1d' is at 6.5 volts, the switch P2' will conduct current. N20 becomes non-conducting to prevent P2' from conducting. Switch P2 prevents N20 from becoming forward biased when Vin is less than Vss.

Switch P1 also should does not turn off when Vin is above five volts. PMOS switch P20 is used to turn off switch P1 when Vin is above five volts. Switch P20 is driven by charge pump X10 which is further described in connection with FIG. 8. Charge pump X10 is capable of generating voltages over five volts.

To insure the maximum bulk voltages of switches P21 and P1 are greater than or equal to the source or drain voltages, two switches N21 and P21 and a comparator 50 are provided. Switches P21 and N21 each have a drain terminal P21d and N21d, bulk terminal P21b and N21b, gate terminal P21g and N21g and a source terminal P21s and N21s. Comparator 50 has an inverting terminal 52, a noninverting terminal 54 and an output terminal 56.

Gate terminals P21g and N21g are connected to output terminal 56. Output voltage OUT2 from voltage buffer is connected to drain terminal N21d. Source terminals N21s and P21s and bulk terminal P21b are connected to bulk terminals P20b and P1b'. Drain terminal P21d is connected to source terminal P20s. Non-inverting terminal 54 is connected to voltage vag. Inverting terminal 52 is connected to input voltage Vin. Switch pair N21 and P21 operate to connect bulk terminals P20b and P1b' and P3b' to input voltage Vin through comparator 50 when Vin is greater than vag (i.e., P21 is on and N21 is off). When Vin is less than vag, comparator 50 turns off P21 and turns on N21 allowing voltage buffer 32' to drive bulk terminals P20b, P3' and P1b'. Both switches N21 and P21 are required to prevent undesirable forward biasing of either switch.

Charge pump X10 has inputs Vref_hi3 and Vref_lo3 connected to outputs out1 and out2 of voltage buffer 32', respectively. Output out10 of charge pump X10 is connected to gate terminal P20g and a collector PNP1c of transistor PNP1. Base terminal PNP1b is connected to base terminal P3b', P1b', P20b, P21b, P21s and N21s. Emitter terminal PNP1e is connected to ground.

Referring now to FIG. 8, charge pump X10 functions similarly to the charge pump of FIG. 4. However, the high portion of clock signal clk3 is divided into two signals clk3a and clk3b. Clock signal clk3a is another precharge phase. During clock clk3a, output OUT10 is driven toward the voltage of OUT1 of buffer 32. During clock phase clk3b, output OUT10 is driven toward the voltage of OUT1 of buffer 32 plus VDD.

Charge pump X10 includes several MOSFET switches each having gate, source, bulk and drain terminals connected as shown. Drain terminal N22d is connected to input vref_lo3 of charge pump X10. Source terminal N22s is connected to drain terminal N23d. Drain terminal N24d is connected to input vref_hi3 of charge pump X10. Source terminal N24s is connected to drain terminal N23d and to drain terminal N25d. Source terminal N25s is connected to VSS. Gate terminal N22g is connected to clock signal clk1. Gate terminal N24g is connected to clock signal clk3a. Gate terminal N25g is connected to clock signal clk2. Bulk terminals N24b and N25b are connected to VSS. Gate terminal N23g is connected to Vdd. Source terminal N23s and bulk terminal P23b are connected to source terminals P22s and P23s and bulk terminal P22b. Gate terminal P23g is connected to inverted clock signal clk3b. Gate terminal P22g and drain terminal P23d are connected to drain terminal N26d. Gate terminal N26g is connected to VDD. Source terminal N26s is connected to drain terminals N27d, N28d, and N29d. Source terminals N27s, N28s, and N29s are connected to Vss. Gate terminals N27g, N28g, and N29g are connected to clock signals clk3a, clk1, and clk2, respectively. Drain terminal P22d is connected to output terminal OUT10. Source terminal P25s is connected to bulk terminal P25b and Vdd. Gate terminal P25g is connected to inverted clock signal clk3b. Drain terminal P25d is connected to one end of resistor 58.

Source terminal N30s is connected to VSS. Gate terminal N30G is connected to clock signal clk2. Source terminal N31s is connected to VSS. Gate terminal N31g is connected to clock signal clk3a. Drain terminals N30d and N31d and one end of resistor 58 are connected to one electrode of capacitor 60. The opposite electrode of capacitor 60 is connected to output terminal OUT10.

Switches N23 and N26 are used to protect N22, N24, N25, N27, N28 and N29 from excessive gate oxide voltages. The voltages at P23d and P23s may temporarily exceed 6.5 volts due to charge injection when the voltage at switch P23g transitions from zero to five volts. Switch N23 and N26 form a voltage divider so that the maximum gate oxide voltage across any switch is five volts.

Referring now to FIGS. 6–8, during clock signal clk3b, gate terminal P22g is shorted to source terminal P22s by switch P23. P22 is then off and the signal from output terminal OUT10 of charge pump X10 floats. At the same time, switch N25 causes a five volt transition in OUT 10 via capacitor 60. When the voltage of output signal OUT10 rises, the drain-to-bulk junction of P22 forward biases. The bulk voltage of P22 and P23 will track output signal OUT10. Transistor PNP1 clamps output signal OUT10 to Vb1+Vbe, which when Vin>vag, equates to output signal OUT10 to Vin+Vbe. This turns P20 off when Vin is 6.5 volts. Thus, the maximum gate voltage of P20 when driven by charge pump X10 is Vin+Vbe which is higher than charge pump X9 would provide. Thus, when Vin exceeds the power supply voltage, charge pump X10 is used to control P1.

As would be evident to one skilled in the art, several modifications of the invention may be made while still being within the scope of the appended claims. For example, if the type of MOSFET switches is changed, the circuitry associated with the new type of switch will be modified to accommodate the characteristics of the switch.

What is claimed is:

1. An interface circuit interfacing a sensor to a switched capacitor circuit and a processing component, said processing component having a power supply voltage range, said sensor having an output voltage range outside said power supply voltage, said interface circuit comprising:

a MOSFET coupled between said sensor and said switched capacitor circuit for connecting said output voltage to said switched capacitor circuit, said MOS- FET having a gate oxide layer, a switch conducting-state resistance, a gate voltage and a bulk voltage; and a control circuit coupled to said output of said sensor and to said MOSFET, said control circuit continually adjusting said gate voltage and said bulk voltage in relation to said output voltage to prevent a voltage across said gate oxide layer from exceeding a predetermined value.

2. An interface circuit as recited in claim 1 wherein said predetermined value corresponds to time dependent dielectric breakdown.

3. An interface circuit as recited in claim 1 wherein said control circuit maintains a predetermined conducting state resistance for said MOSFET switch.

4. An interface circuit as recited in claim 1 wherein said MOSFET switch means comprises a PMOS switch.

5. An interface circuit interfacing a sensor to a switched capacitor circuit and a processing component, said processing component having a power supply voltage range, said sensor having an output voltage range outside said power supply voltage, said interface circuit comprising:

a first MOSFET switch receiving said output signal of said sensor;

a voltage buffer connected to said first MOSFET switch, said voltage buffer having a voltage buffer output voltage greater than said output voltage of said sensor;

a first charge pump connected to said first MOSFET generating a first control voltage, said first charge pump selectively and continually adjusting said first control voltage in relation to said output voltage of said sensor to prevent time dependent dielectric breakdown of said gate oxide layer;

a second MOSFET switch connected to said first MOSFET switch, said second MOSFET having a bulk-source junction and a conducting state;

a second charge pump connected to said second MOSFET switch, said second charge pump generating a second control voltage, said second charge pump adjusting said second control voltage so that when said second MOSFET is conducting said bulk-source junction of said second MOSFET switch is forward biased; and a switched capacitor circuit electrically coupled to said first MOSFET switch and said second MOSFET switch, providing a translated output corresponding to a predetermined translation of said input voltage of said sensor to within said power supply voltage range of said processing component.

6. An input circuit as recited in claim 5 further comprising a third MOSFET switch coupled to said second MOSFET switch for preventing said second MOSFET switch from conducting current when the output voltage of said sensor is greater than said power supply voltage.

7. An input circuit as recited in claim 5 wherein said first MOSFET switch has a conducting state resistance, and wherein said charge pump maintains a predetermined conducting state resistance.

8. An input circuit as recited in claim 5 wherein said voltage buffer includes a source follower circuit.

9. An input circuit as recited in claim 5 further comprising a third charge pump, a PNP transistor, and a fourth MOSFET switch operatively connected to said first MOSFET switch, said third charge pump, said PNP transistor and said fourth MOSFET switch controlling said first MOSFET switch when said input voltage exceeds said power supply voltage.

10. An input circuit as recited in claim 5 further comprising a fourth MOSFET switch means, a comparator circuit, and a reference voltage, said comparator having an output, an inverting input, and a non-inverting input, said comparator output connected to said fourth MOSFET switch, said inverting terminal connected to said input voltage and said non-inverting terminal connected to said reference voltage said fourth MOSFET switch means coupling said comparator output to said first MOSFET switch means when said sensor output voltage is greater than said reference voltage.

11. An input circuit as recited in claim 10 wherein said reference voltage is half of said power supply voltage.

12. An input circuit for a processing component connected between an output of a sensor and said processing component, said sensor having a sensor output with a sensor voltage range referenced to ground, said processing component having a power supply voltage range, said circuit comprising:

a first MOSFET switch having a first source terminal, a first game terminal, a first bulk terminal and a first drain terminal, said first source terminal coupled to said output of said sensor;

a voltage buffer connected to said first bulk terminal, said voltage buffer having an output voltage of at least said sensor ground and greater than said output voltage of said sensor;

a first charge pump connected to said first gate terminal generating a first gate voltage, said first charge pump selectively and continually adjusting said first gate voltage in relation to said output voltage of said sensor to prevent time dependent dielectric breakdown of said gate oxide layer;

a second MOSFET switch having a second source terminal, a second gate terminal, a second bulk terminal and a second drain terminal, said second source terminal connected to said first drain terminal, said second drain terminal connected to said sensor ground, said second bulk terminal and said second source terminal forming a bulk-source junction, said second MOSFET switch having a conducting state resistance;

a second charge pump connected to said second gate terminal controlling said second MOSFET switch so that when said second MOSFET is conducting said bulk-source junction of said second MOSFET switch is forward biased; and a switched capacitor circuit electrically connected to said first drain terminal and said second source terminal, providing a translated output corresponding to a predetermined translation of said input voltage of said sensor within said power supply voltage range of said processing component.

13. An input circuit as recited in claim 12 further comprising a third MOSFET switch coupled to said second MOSFET switch for preventing said second MOSFET switch from conducting current when the input voltage is greater than said power supply voltage.

14. An input circuit as recited in claim 12 wherein said first MOSFET switch has a conducting state resistance, and wherein said charge pump maintains a predetermined conducting state resistance.

15. An input circuit as recited in claim 14 wherein said switch capacitor circuit comprises a operational amplifier having an output terminal, an inverting input terminal, and a non-inverting input terminal, said operational amplifier having a first capacitor selectively switched between said inverting input terminal and said output terminal and said second capacitor connected to said inverting terminal of said operational amplifier and a reference voltage connected to said non-inverting terminal, said second capacitor capacitively coupling said switched capacitor circuit to said first MOSFET switch.

16. An input circuit as recited in claim 13 wherein said reference voltage is half of said power supply voltage.

17. An input circuit as recited in claim 12 wherein said voltage buffer including a source follower circuit.

18. An input circuit as recited in claim 12 further comprising a third charge pump, a PNP transistor, and a fourth MOSFET switch operatively connected to said first MOSFET switch, said third charge pump, said PNP transistor and said fourth MOSFET switch controlling said first MOSFET switch when said sensor output voltage exceeds said power supply voltage.

19. An input circuit as recited in claim 13 further comprising a fourth MOSFET switch means, and a comparator circuit, said comparator circuit providing a bulk voltage to said first MOSFET switch when said sensor output voltage exceeds the power supply voltage.

20. An input circuit as recited in claim 12 further comprising a fourth MOSFET switch means, a comparator circuit said comparator having an output, an inverting input, and a non-inverting input, said output connected to said fourth MOSFET switch, said inverting terminal connected to said input voltage and said non-inverting terminal connected to said reference voltage said fourth MOSFET switch means coupling said output to said first MOSFET switch means when said sensor output voltage is greater than said reference voltage.

* * * * *